US007315367B2

(12) United States Patent
Meyer et al.

(10) Patent No.: US 7,315,367 B2

(45) Date of Patent: Jan. 1, 2008

(54) DEFINING A PATTERN ON A SUBSTRATE

(75) Inventors: Gerhard Meyer, Adliswil (CH); Hanspeter Ott, Thalwil (CH); Reto Schlittler, Schoenenberg (CH); Percy Zahl, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 11/154,450

(22) Filed: Jun. 16, 2005

(65) Prior Publication Data

US 2005/0280792 A1 Dec. 22, 2005

(30) Foreign Application Priority Data

Jun. 17, 2004 (EP) ................................ 04405369

(51) Int. Cl.
*G01N 21/00* (2006.01)

(52) U.S. Cl. ................................ 356/237.5; 256/237.4

(58) Field of Classification Search ............ 356/237.4, 356/237.5

See application file for complete search history.

(56) References Cited

U.S. PATENT DOCUMENTS 6,313,905 B1 * 11/2001 Brugger et al. ............... 355/55
2005/0046832 A1 * 3/2005 Kaller ..................... 356/239.2

* cited by examiner

*Primary Examiner*—Gregory J. Toatley, Jr.
*Assistant Examiner*—Juan D Valentin, II
(74) *Attorney, Agent, or Firm*—Louis P. Herzberg

(57) ABSTRACT

The invention provides methods and apparatus for defining a pattern on a substrate. An example apparatus includes: an emission source for directing an emission to the substrate, defining a working position between the emission source and the substrate, at least one shadow mask having one or more apertures and at least one inspection device for inspecting the properties of the substrate and/or the pattern, the inspection device having at least one inspection tool. The shadow mask and the inspection tool are separately provided on a movable portion, so that the shadow mask and the inspection tool are subsequently movable into the working position. The invention is further related to a method for defining a pattern on a substrate.

13 Claims, 3 Drawing Sheets

DEFINING A PATTERN ON A SUBSTRATE

TECHNICAL FIELD

The present invention is related to an apparatus and method for defining a pattern on a substrate using a shadow masking technique.

BACKGROUND OF THE INVENTION

In defining a pattern on a substrate, the shadow masking technique is well known. It allows efficient fabrication of patterns by replacing the conventional lithography cycle which includes deposition, photo and etch process steps by just one single process and machine. In common shadow masking techniques an emission source which may for example emit electromagnetic radiation, elementary particles or materials is directed to a substrate like for example a polished silicon slice. Between the emission source and the substrate there is provided a shadow mask with one or more apertures. The emission is directed through the aperture of the shadow mask and at the substrate, thereby producing changes on or in the substrate in a region of the substrate where the emission impinges. The shadow masking technique allows fabrication of complex patterns having a high density.

In U.S. Pat. No. 6,313,905 B1 there is disclosed an apparatus for defining a pattern on a substrate, said apparatus using the above-mentioned shadow masking technique. The known apparatus comprises an evaporation source and a material source, respectively. Said source emits an emission directed to a substrate holder on which the substrate is positioned. The apparatus further comprises a moving portion which consists of an elongated flexible member and a tip, said tip moving over the surface of the substrate during patterning. The flexible member has an aperture so that the emission from the emission source could pass the flexible member through said aperture and impinge on the substrate. By moving the movable portion above the substrate a variety of different patterns could be generated on or in the substrate. The tip of the flexible member proves advantageous because the tip is able to follow the surface of the substrate very closely when scanning the surface. The tip is primarily used as a distance-controlling means thus allowing one to position the flexible member which acts as a shadow mask in close and at a well defined distance to the surface of the substrate. However, the tip may further be used for pattern inspection, inspection of electrical properties, in-situ functional testing etc., i.e. the tip is further used for inspecting the properties of the pattern and the substrate, respectively. In a special embodiment of the known apparatus the Atomic Force Microscopy (AFM) principle is used for distance regulation and for identifying nano-scale features of the pattern, said moving portion consisting of a common cantilever with a tip, wherein the cantilever comprises the above-mentioned aperture.

The known apparatus proves itself, however, it has still some disadvantages which have not been overcome yet. First of all it should be mentioned that the known apparatus is not able to create patterns in a large area of the substrate in an appropriate time, i.e. in order to create a pattern in a large area the moving portion has to be moved over the whole area which leads to a loss of time so that an efficient and thus cheap prototyping of nano-structures is prevented even if larger flexible members are used. Above this, the known apparatus does not allow one to use a variety of different masks, instead it can only use the mask being defined by the flexible member with its apertures. Therefore, the flexibility of the known apparatus is limited. Further, the inspection of the properties of the generated pattern has to be performed immediately after the generation of a certain part of the pattern to be inspected, since after the generation of the whole pattern it will be difficult to retrieve that certain part of the pattern. In the latter case a difficult and time consuming search for that certain part of the pattern has to be carried out.

SUMMARY OF THE INVENTION

It is therefore an aspect of the present invention to provide an apparatus for defining a pattern on a substrate which allows one to define complex large area patterns, to inspect the properties of said pattern and to use multiple masks in an appropriate time. It is a further object of the present invention to provide a method for defining a pattern on a substrate having the aforementioned advantages.

An apparatus according to the invention comprises an emission source for directing an emission to the substrate. An emission source is any source which emits electromagnetic radiation, elementary particles or materials. An emission source may for example be a conventional light source, an optical system comprising a light source and one or more glass fibers, an electron source, an ion source, an evaporation source etc. By providing an emission source and a substrate there is defined a working position between the emission source and the substrate. The emission source may for example be exchangeably provided at the apparatus. There may also be provided more than one of the mentioned emission sources. Both variants would lead to a multifunctional apparatus.

The apparatus further comprises at least one inspection device for inspecting the properties of the substrate and/or the pattern, the inspection device having at least one inspection tool. Said properties may for example be physical, chemical, electrical and functional properties of the pattern.

According to the invention, the shadow mask and the inspection tool as well as further masks or tools are separately provided on a movable portion. The shadow masks and inspection tools are arranged separately. By mounting the shadow masks and the inspection tools separately on a movable portion, they are subsequently movable into the working position defined between the emission source and the substrate. In contrast to the prior art, this separate arrangement of shadow masks and inspection tools involves the following advantages.

According to an advantageous embodiment of the invention there is provided a locking mechanism for locking the movable portion, so that the shadow mask and the inspection tool, respectively, may be locked in the working position.

According to a further advantageous embodiment of the apparatus the shadow masks and the inspection tools are provided on separate carriers, said carriers being exchangeably mounted on the movable portion.

According to another advantageous embodiment of the invention there are provided mounting mechanisms for mounting each carrier on the movable portion in order to simplify the attachment, detachment and positioning of the carriers.

According to a further advantageous embodiment of the invention said mounting mechanism comprises protrusions being insertable into corresponding recesses.

According to a further advantageous embodiment of the apparatus according to the invention the movable portion is a rotatable table, so that the shadow masks and the inspection tools are rotatable into the working position.

According to a further aspect of the invention the inspection device is a Scanning Probe Microscopy (SPM) device, preferably a Scanning Tunnel Microscopy (STM) device, an Atomic Force Microscopy (AFM) device, a Dynamic Force Microscopy (DFM) device or a Scanning Near-field Optical Microscopy (SNOM) device.

DESCRIPTION OF THE DRAWINGS

Advantageous embodiments of the present invention will now be described, by way of example only, with reference to the drawings, in which.

Figure 1:
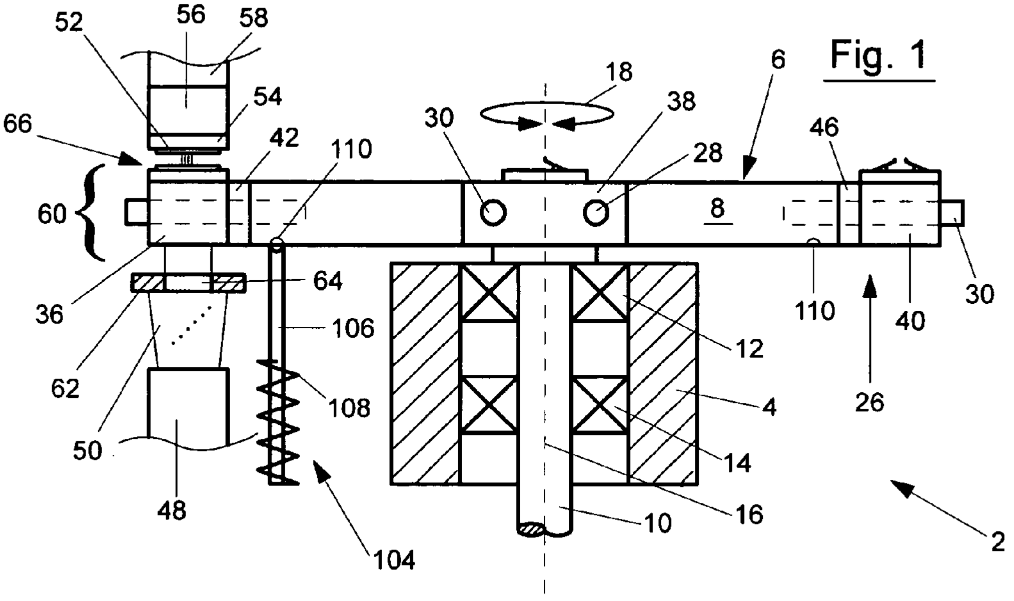
FIG. 1 shows a side view of an embodiment of the apparatus for defining a pattern on a substrate.

The drawings are provided for illustrative purposes only.

DETAILED DESCRIPTION OF THE INVENTION

The present invention provides an apparatus for defining a pattern on a substrate which allows one to define complex large area patterns, to inspect the properties of said pattern and to use multiple masks in an appropriate time. It is a further object of the present invention to provide a method for defining a pattern on a substrate having the aforementioned advantages.

Thus, the present invention is directed to the apparatus for defining a pattern on a substrate. A substrate is the underlying basis where patterns and devices are built on or in. Substrates may for example be semiconductors such as polished silicon slices, glass plates, plastics, organic materials, photoresists, and etcetera. A pattern is any local modification of given shape on or in a substrate. A pattern may for example consist of metal wires deposited on the substrate, local changes of a chemical or physical property like colour, reflectivity, electric charge, excitation state or magnetization, exposed areas in a photoresist, local implants of a different material, etcetera.

An apparatus according to the invention comprises an emission source for directing an emission to the substrate. An emission source is any source which emits electromagnetic radiation, elementary particles or materials. An emission source may for example be a conventional light source, an optical system comprising a light source and one or more glass fibers, an electron source, an ion source, an evaporation source etc. By providing an emission source and a substrate there is defined a working position between the emission source and the substrate. The emission source may for example be exchangeably provided at the apparatus. There may also be provided more than one of the mentioned emission sources. Both variants would lead to a multifunctional apparatus.

There is further provided at least one shadow mask having one or more apertures. The aperture is an arbitrarily shaped opening or hole in the shadow mask which allows materials, ions, electrons or light to pass through while those emissions which are not directed to the apertures are blocked by the surface of the shadow mask. Such apertures can be created using optical- or e-beam-lithography, Focused Ion Beam (FIB) technology and standard micromechanical fabrication techniques for etching such as isotropic wet etching. An aperture may for example have a circular, a rectangular, an arcuate or a much more complex shape, while the walls of the apertures could be vertically oriented or inclined. The shadow mask itself could be made of a chip with a membrane, said membrane comprising the above-mentioned apertures.

The apparatus further comprises at least one inspection device for inspecting the properties of the substrate and/or the pattern, the inspection device having at least one inspection tool. Said properties may for example be physical, chemical, electrical and functional properties of the pattern. The inspection device may for example be a device working according to the Atomic Force Microscopy (AFM) or the Scanning Tunnel Microscopy (STM) principle which allows topographic surface and pattern inspection. The inspection tool is able to interact with the substrate in a contacting or non-contacting manner so that the inspection device is able to receive the corresponding information about the pattern and/or the substrate. In case, the Atomic Force Microscopy (AFM) principle is used, the inspection tool may be an AFM cantilever; in case Scanning Tunnel Microscopy (STM) principle is used the inspection tool may be a tungsten wire with an etched tip.

According to the invention, the shadow mask and the inspection tool as well as further masks or tools are separately provided on a movable portion, i.e. in contrast to the apparatus known from U.S. Pat. No. 6,313,905 B1 the shadow masks and inspection tools are arranged separately. By mounting the shadow masks and the inspection tools separately on a movable portion, they are subsequently movable into the working position defined between the emission source and the substrate. In contrast to the prior art, this separate arrangement of shadow masks and inspection tools involves the following advantages.

On the one hand, it is possible to use different masks, so that complex patterns can be created on or in the substrate. It is not necessary to transfer the substrate to another apparatus having a different shadow mask. Above this, the dimension of the shadow mask is not limited to the dimension of a cantilever of the inspection device so that large area patterns are realisable in short time by using corresponding larger shadow masks with a more complex arrangement of apertures. On the other hand, multiple inspection methods could be carried out by different inspection devices and tools without transferring the substrate to another apparatus which leads to problems concerning the search for a certain part of the pattern to be inspected. Thus, the invention allows a fast and cheap production and inspection of a pattern on a substrate.

In an advantageous embodiment of the invention there is provided a locking mechanism for locking the movable portion, so that the shadow mask and the inspection tool, respectively, may be locked in the working position. In this way, it is possible to restore the position of the shadow mask after an intermittent inspection of the pattern and vice versa. Time-consuming searching methods could be prevented. Most preferably the locking mechanism consists in a snap-in locking mechanism so that the shadow mask or the inspection tool are automatically locked when they reach the working position.

In a further advantageous embodiment of the apparatus the shadow masks and the inspection tools are provided on separate carriers, said carriers being exchangeably mounted on the movable portion. By providing the accident sensitive shadow masks and inspection tools on carriers it is easier to exchange and handle said masks and tools without damaging them. Above this, an almost unlimited number of masks and tools can be used for patterning or inspecting even if there are only provided a few mounting places for the carriers.

In another advantageous embodiment of the invention, there are provided mounting mechanisms for mounting each carrier on the movable portion in order to simplify the attachment, detachment and positioning of the carriers. Said mounting mechanism comprises a limit stop element for holding the carrier in a predefined position. A limit stop element may for example be defined by a part of the movable portion or by a distance piece arranged between the movable portion and the carrier. In order to secure the carrier in its predefined position there may further be provided fasteners, like magnets for example.

According to a further advantageous embodiment of the invention, said mounting mechanism comprises protrusions being insertable into corresponding recesses. Preferably two parallel rod-like protrusions are provided which may be inserted into corresponding parallel recesses. Both protrusions may be provided at the movable portion, the recesses being provided in the above-mentioned carriers and vice versa. By providing two parallel rod-like protrusions with corresponding recesses in the counterpiece an easy attachment and detachment of the shadow mask and the inspection tool is possible by simply sticking the counterpieces together.

According to a further advantageous embodiment of the apparatus according to the invention the movable portion is a rotatable table, so that the shadow masks and the inspection tools are rotatable into the working position. Thus, the movable portion can be actuated by simply rotating the rotatable table so that this embodiment is well suited to be used in Ultra High Vacuum (UHV) environment especially when combined with the above-mentioned snap-in locking mechanism.

In another advantageous embodiment of the invention a substrate holder is provided, the substrate holder being movable in a three-dimensional manner. The movement of the substrate holder in a three-dimensional manner may for example be realised by using a Piezoelectric Tube (PZT) scanner which allows small movements in x-, y- and z-direction. The PZT scanner itself may be arranged on a micro-slider-stage, which allows bigger movements in x-, y- and z-direction for coarse approach and positioning. According to this embodiment static patterning as well as dynamic patterning is possible. Static patterning means that the substrate is in a fixed position relative to the shadow mask while the substrate is moved relative to the shadow mask during dynamic patterning. Above this, it should further be mentioned that multi-static and even multi-dynamic patterning could be performed due to the fact that a variety of different aligned shadow masks can be used.

According to a further aspect of the invention the inspection device is a Scanning Probe Microscopy (SPM) device, preferably a Scanning Tunnel Microscopy (STM) device, an Atomic Force Microscopy (AFM) device, a Dynamic Force Microscopy (DFM) device or a Scanning Near-field Optical Microscopy (SNOM) device. The functionality of said devices as well as the properties which could be inspected by such devices are well known so that further declarations concerning these devices are superfluous. However, it should be mentioned that all or some of the above-mentioned inspection devices could be included in one apparatus because according to the invention there may be provided more than one inspection device. Thus, an extensive in-situ inspection of the pattern is possible without having to transfer the substrate.

According to another advantageous embodiment of the invention a second inspection device is provided, the second inspection device having at least two, preferably four, inspection tools with contacts for electrically contacting the pattern. Thus, the second inspection device allows one to inspect the electrical properties and the functioning of the pattern, e.g. the electrical properties and the functioning of metal wires deposited on the substrate can be inspected. The inspection tools may for example comprise cantilevers carrying micrometer-sized contacts at one end.

According to a further aspect of the invention the arrangement of the afore-mentioned contacts corresponds to the arrangement of the apertures in the shadow mask. That means that every single contact would be arranged within a region which is covered by a corresponding aperture in the shadow mask when viewed from above. Thus, a fast inspection of a recently produced pattern is possible which will become apparent by considering the following example: It is assumed that a static patterning process has been performed so that the arrangement of the pattern created on the substrate corresponds to the arrangement of the apertures of the shadow mask. After removing the shadow mask and moving the inspection tools of the second inspection device into the working position the contacts will exactly fit to the pattern created on the substrate if the shadow mask and the inspection device have been properly aligned before. Therefore, it is not necessary to have optical controls or even visible contacts so that a simple apparatus can be provided which is easy to handle.

According to another advantageous embodiment of the invention a distance-controlling means is provided for controlling the distance between the substrate and the shadow mask. The substrates and the shadow masks are at least partially metal coated so that the resistance and/or the capacity between the substrate and the shadow mask can be measured. Said measured resistance or capacity between the substrate and the shadow mask is the measured variable for the distance-control. Each measured value of resistance or capacity corresponds to a particular distance between the shadow mask and the substrate so that an accurate distance-control is possible. Additionally, there may be provided an optical vision means for optically controlling the distance between the shadow mask and the substrate which is useful for coarse approach and positioning.

A method for defining a pattern on a substrate comprises the following steps: providing a substrate and an emission source being directed to the substrate, defining a working position therebetween; moving a shadow mask with at least one aperture into the working position; emitting emissions from the emission source through the aperture and towards the substrate in order to define the pattern on the substrate; removing the shadow mask from the working position; moving at least one inspection tool of an inspection device for inspecting the properties of the substrate and/or the pattern into the working position; and finally inspecting the substrate and the pattern with the inspection device.

In an advantageous embodiment the method further comprises the steps of locking the shadow mask and the inspection tool in the working position.

According to another embodiment of the invention the method further comprises the step of controlling the distance between the substrate and the shadow mask, wherein the resistance or capacity between the substrate and the shadow mask is the measured variable for controlling.

It should be noted that the advantages described in connection with the apparatus according to the invention also apply to a system and/or method according to the invention.

Figure 2:
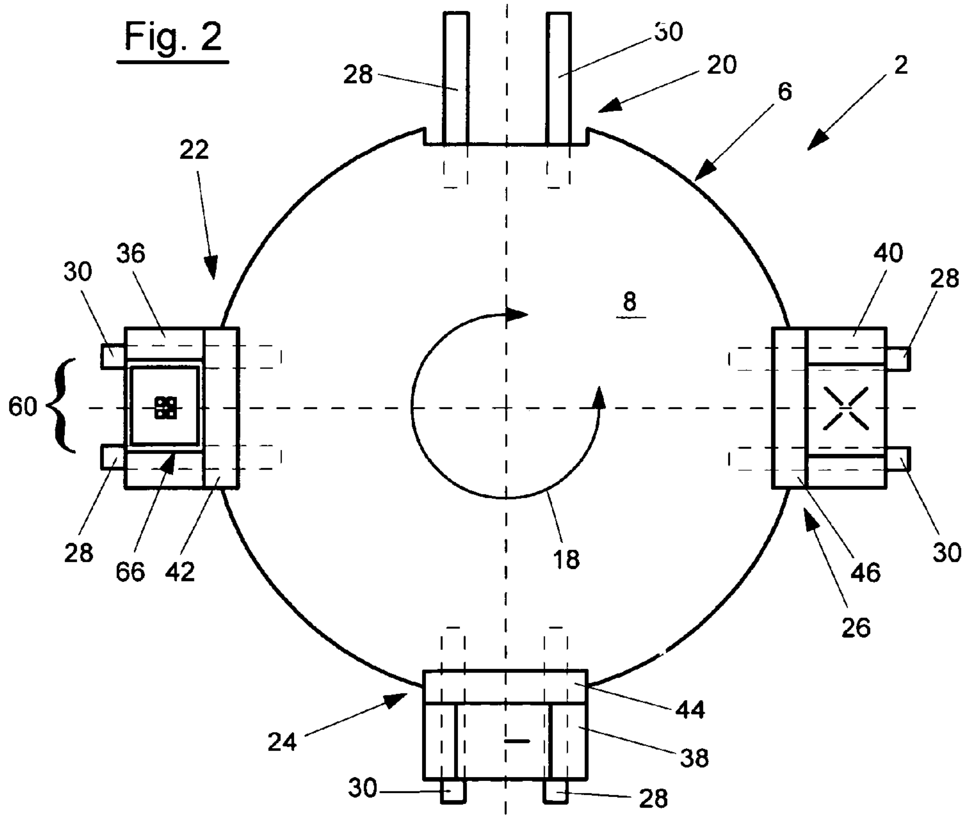
FIG. 2 shows a top view of the table of the apparatus from FIG. 1.

Embodiments are described below with reference to the FIGS. 1 to 8. FIGS. 1 and 2 show an embodiment of the apparatus for defining a pattern on a substrate according to the invention. The apparatus 2 comprises a mount 4 on which a movable portion 6 is arranged. The mount 4 acts as a damping stage, so that vibrations of the ground etc. are damped and not transferred to the movable portion 6. Said movable portion 6 consists of an essentially circular table 8. The circular table 8 is connected with a central shaft 10, which extends into the mount 4. Inside the mount 4 the shaft 10 runs on two ball bearings 12, 14 so that the shaft 10 and the table 8 may be rotated around the central axis 16 of the shaft 10 as indicated by arrow 18 in FIG. 1 and 2. In order to rotate the shaft 10 and the table 8, respectively, there is provided an actuation means which is not shown in the figures.

On the outwardly directed margin of the table 8 there are provided four mounting mechanisms 20, 22, 24, 26. Even though there are provided only four mounting mechanisms 20, 22, 24, 26 in the shown embodiment it goes without saying that there could also be provided more or less mounting mechanisms. Each mounting mechanism 20, 22, 24, 26 comprises a pair of rod-like protrusions 28, 30. Said protrusions 28, 30 are of cylindrical shape and extend outwardly in a substantially radial direction, wherein both protrusions 28, 30 of each mounting mechanism 20, 22, 24, 26 are parallel to each other.

The mounting mechanisms 20, 22, 24, 26 further comprise elongated parallel recesses 32, 34 (shown in FIGS. 3, 5, 7) which have a similar form like the rod-like protrusions 28, 30 so that the rod-like protrusions 28, 30 may be inserted into said recesses 32, 34. The recesses 32, 34 are provided at carriers 36, 38, 40 which are exchangeably mounted on the rotatable table 8 via the mounting mechanisms 20, 22, 24, 26. Said carriers 36, 38, 40 are especially shown in FIGS. 3 to 8. The recesses 32, 34 in the carriers 36, 38, 40 are through-holes so that the rod-like protrusions 28, 30 may extend beyond the margin of the carriers 36, 38, 40 after attaching them to the rotatable table 8 as can be seen in FIGS. 1 and 2. Between the margin of the table 8 and the carriers 36, 38, 40 there may further be provided distance pieces 42, 44,46 which are also exchangeably mounted on the rod-like protrusions 28, 30 and which have essentially the same form as the carriers 36, 38, 40. The margin of the table 8 together with the distance pieces 42, 44, 46 constitutes limit stop elements for the carriers 36, 38, 40, so that the carriers 36, 38, 40 can be easily brought into their predefined positions at the table 8, as shown in FIGS. 1 and 2. There are further provided magnets (not shown) to hold the carriers 36, 38, 40 in their predefined position.

The shown apparatus 2 further comprises an emission source 48 for directing an emission 50 to a substrate 52. The substrate 52 is exchangeably mounted on a substrate holder 54 which is arranged opposite to the emission source 48. The substrate holder 54 is movable in x-, y- and z-direction. In this advantageous embodiment this is realised by a Piezoelectric Tube (PZT) scanner 56 on which the substrate holder 54 is mounted. The PZT scanner 56 is itself in turn mounted on a micro-stage-slider 58 which allows bigger movements in said directions for coarse approach and positioning. In the region between the substrate holder 54 and the emission source 48 there is defined a working position 60 for tools or inspection means. Above this, a shield 62 with a central opening 64 is positioned close to the emission source 48, so that the emission 50 is partially blocked. Between the emission source 48 and the shadow mask (described below) there may further be provided an inclined mirror (usually 45°) which is indicated by dotted lines in FIG. 1. Such a mirror would allow one to monitor the work from below with the help of a long distance microscope (not shown) with CCD, said microscope being arranged beside the mirror. This configuration provides further in-situ controls and inspections.

Figure 3:
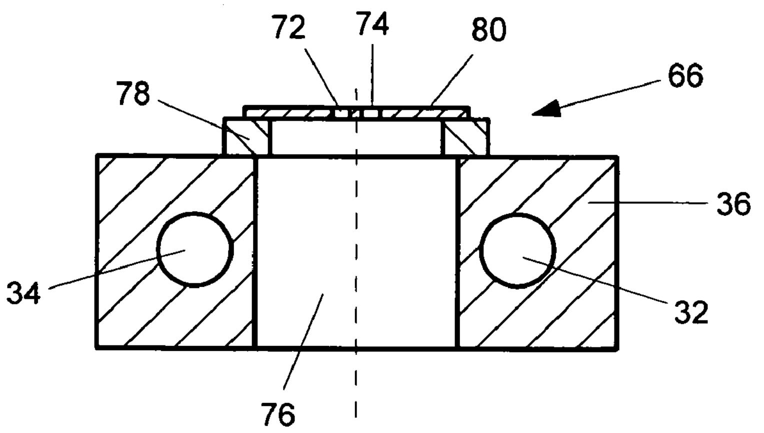
FIG. 3 shows a cross-sectional side view of a carrier with a shadow mask mounted thereon.
Figure 4:
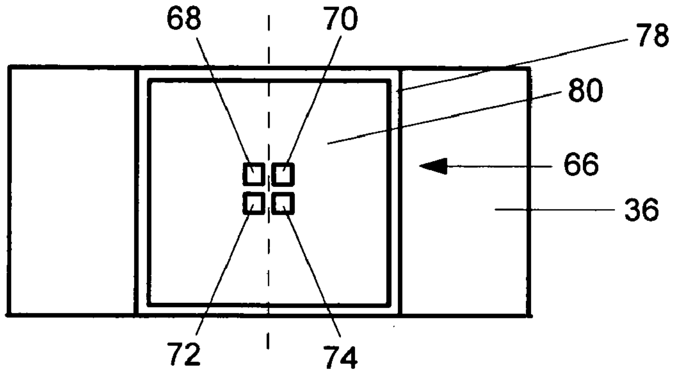
FIG. 4 shows a top view of the carrier from FIG. 3.
Figure 5:
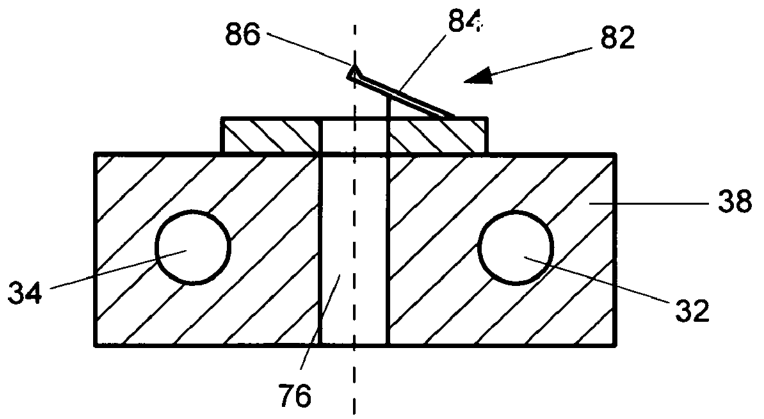
FIG. 5 shows a cross-sectional side view of a carrier with a first inspection tool mounted thereon.
Figure 6:
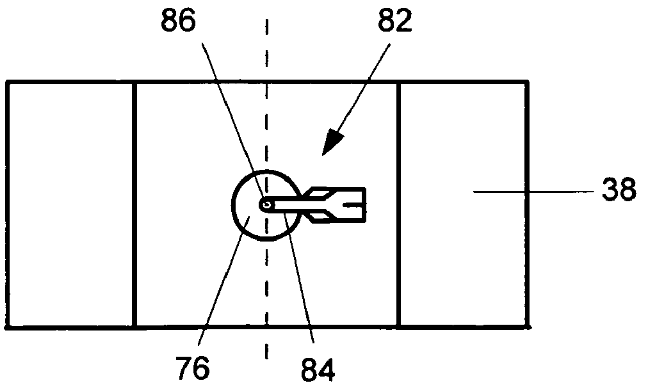
FIG. 6 shows a top view of the carrier from FIG. 5.

The shown apparatus further comprises a shadow mask 66 with four apertures 68, 70, 72, 74 as shown in FIGS. 3, 4. As can especially be seen in FIGS. 3 and 4, the shadow mask 66 is mounted on carrier 36 above a passage 76 which extends vertically through the carrier 36 so that the emission 50 could pass the carrier 36. Said passage 76 further allows monitoring of the shadow mask 66 from below with the microscope and the mirror mentioned above. The shadow mask 66 comprises a frame 78 and a membrane 80, the latter comprising the above-mentioned apertures 68, 70, 72, 74. Said apertures 68, 70, 72, 74 have a rectangular shape and their centers are positioned on the corners of an imaginary square.

There are further provided two inspection devices for inspecting the properties of the substrate 52 and/or the pattern created thereon. The inspection devices are not shown in the figures, however, their inspection tools are shown in the drawings.

The first inspection device is a Scanning Probe Microscopy (SPM) device, like for example a Scanning Tunnel Microscopy (STM) device. Said STM device has one inspection tool 82 which is mounted on carrier 38 (see FIGS. 5 and 6). The inspection tool 82 is a typical inspection tool used in STM devices, i.e. the inspection tool 82 consists of a cantilever 84 with a tip 86 at the end, the tip 86 being directed to the substrate 52 during inspection. Like carrier 36 the carrier 38 comprises a vertical passage 76 allowing the monitoring of the inspection tool 82 and the substrate 52 from below.

Figure 7:
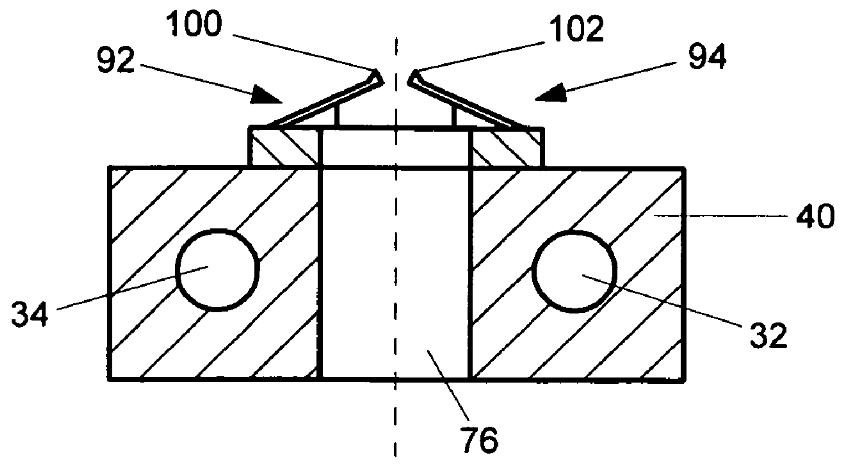
FIG. 7 shows a cross-sectional side view of a carrier with second inspection tools mounted thereon.
Figure 8:
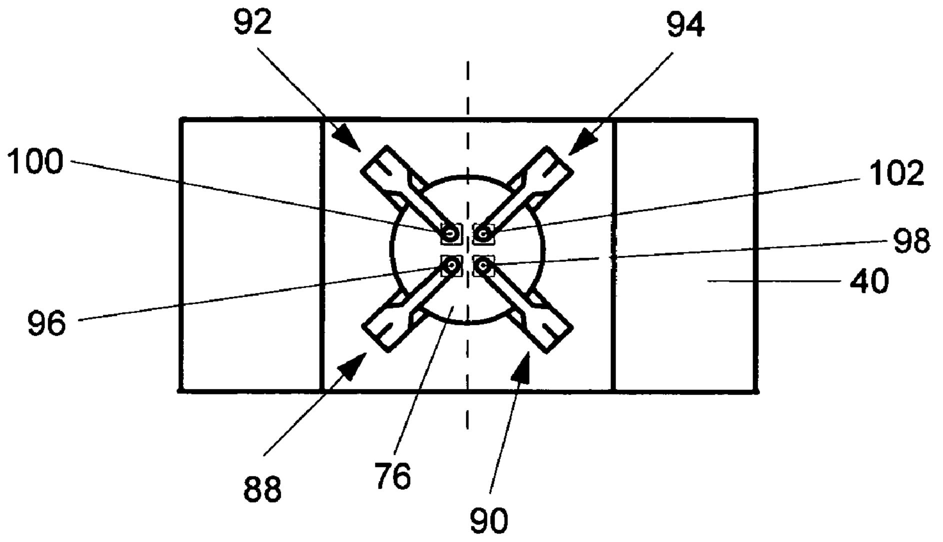
FIG. 8 shows a top view of the carrier from FIG. 7

The second inspection device is used to inspect the electrical properties and the functioning of the pattern created on the substrate, e.g. the electrical properties and the functioning of metal wires deposited on the substrate can be inspected. Therefore, four inspection tools 88, 90, 92, 94 are provided which comprise micrometer-sized contacts 96, 98, 100, 102 for electrically contacting the pattern. Like the inspection tool 82 of the first inspection device, the inspection tools 88, 90, 92, 94 of the second inspection device are mounted on a separate carrier 40, as can be seen in FIGS. 7 and 8, said carrier 40 having a vertical passage 76 for monitoring the inspection tools 88, 90, 92, 94 and the substrate 52 from below. The arrangement of the contacts 96, 98, 100, 102 corresponds to the arrangement of the apertures 68, 70, 72, 74 in the shadow mask 66, i.e. in the shown embodiment the contacts 96, 98, 100, 102 are positioned on the corners of the imaginary square mentioned above. The apertures 68, 70, 72, 74 in the shadow mask 66 are indicated in FIG. 8 in order to make said arrangement more clear.

It is clear from the aforesaid, that the shadow masks 66 and the inspection tools 82, 88, 90, 92, 94 of the different inspection devices are separately provided on separate carriers 36, 38 and 40, the latter being exchangeably mounted on the rotatable table 8. The table 8 is arranged such that the shadow mask 66, the inspection tools 82 of the first inspection device and the inspection tools 88, 90, 92, 94 of the second inspection device are subsequently rotatable into the working position 60 defined between the emission source 48 and the substrate 52, which leads to the advantages described above.

In order to ensure an accurate and repeatable positioning of the shadow mask 66 or of the inspection tools 82 and 88, 90, 92, 94 in the working position 60 there is further provided a snap-in locking mechanism 104 (see FIG. 1). Said locking mechanism 104 comprises a locking bar 106 which is prestressed against the table 8 via a spring element 108. The table 8 comprises recesses 110 provided in proximity to each mounting mechanism 20, 22, 24, 26. When the shadow mask 66 or the inspection tools 82 and 88, 90, 92, 94 are rotated into the working position 60, the locking bar 106 snaps into said recess 110 and thus locks the table 8. It goes without saying that said recesses 110 may also be provided in the carriers or somewhere else as long as the table 8 is locked in this position.

The apparatus 2 further comprises distance-controlling means (not shown) for controlling the distance between the substrate 52 and the shadow mask 66. The substrate 52 and the shadow mask 66 are at least partially metal coated; the resistance or capacity between the substrate 52 and the shadow mask 66 being the measured variable for the distance-control. Additionally, there may be provided a further long distance microscope (not shown) with CCD at a side so that the distance between or the separation of the shadow mask 66 and the substrate 52 can be monitored.

In the following an operation mode of the shown apparatus will be described. After the attachment of the substrate 52 at the substrate holder 54 the table 8 is rotated around axis 16 until the shadow mask 66 reaches the working position 60. In this position the locking bar 106 snaps into the recess 110 so that the table 8 is locked. Afterwards an emission 50 is emitted from the emission source 48 through the central opening 64 in the shield 62, through the apertures 68, 70, 72, 74 in the shadow mask and towards substrate 52 so that a pattern is created thereon. In a following step, the table 8 is unlocked and the shadow mask 66 is removed from the working position 60 by rotating the table 8 until one of the inspection tools 82 or 88, 90, 92, 94 reaches the working position 60. Then, the table 8 is locked again and the inspection of the pattern or the substrate 52 can be performed, and so on.

Variations described for the present invention can be realized in any combination desirable for each particular application. Thus particular limitations, and/or embodiment enhancements described herein, which may have particular advantages to the particular application need not be used for all applications. Also, not all limitations need be implemented in methods, systems and/or apparatus including one or more concepts of the present invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

The invention claimed is:

1. An apparatus for defining a pattern on a substrate, said apparatus comprising an emission source for directing an emission to the substrate, a working position being defined between the emission source and the substrate, at least one shadow mask having one or more apertures, and at least one inspection device for inspecting the properties of the substrate and/or the pattern, the inspection device having at least one inspection tool, wherein the shadow mask and the inspection tool are separately provided on a movable portion, so that the shadow mask and the inspection tool are subsequently movable into the working position.

2. An apparatus according to claim 1, wherein a locking mechanism for locking the movable portion is provided, so that the shadow mask and the inspection tool are lockable in the working position.

3. An apparatus according to claim 1, wherein the shadow mask and the inspection tool are provided on separate carriers, said carriers being exchangeably mounted on the movable portion.

4. An apparatus according to claim 3, wherein mounting mechanisms are provided for mounting each carrier on the movable portion, at least one of the mounting mechanisms comprising a limit stop element for holding the carrier in a predefined position.

5. An apparatus according to claim 4, wherein the mounting mechanism comprises protrusions being insertable into corresponding recesses.

6. An apparatus according to claim 1, wherein the movable portion is a rotatable table, so that the shadow mask and the inspection tool are rotatable into the working position.

7. An apparatus according to claim 1, wherein a substrate holder is provided, the substrate holder being movable in a three-dimensional manner.

8. An apparatus according to claim 1, wherein the inspection device is a Scanning Probe Microscopy (SPM)-device, including one of an STM-, AFM-, DFM- and SNOM-device.

9. An apparatus according to claim 2, wherein the shadow mask and the inspection tool are provided on separate carriers, said carriers being exchangeably mounted on the movable portion.

10. An apparatus according to claim 2, wherein the movable portion is a rotatable table, so that the shadow mask and the inspection tool are rotatable into the working position.

11. An apparatus according to claim 3, wherein a substrate holder is provided, the substrate holder being movable in a three-dimensional manner.

12. An apparatus according to claim 2, wherein a distance-controlling means is provided for controlling the distance between the substrate and the shadow mask, the substrate and the shadow mask being at least partially metal coated, the resistance or capacity between the substrate and the shadow mask being the measured variable for the distance-control.

13. An apparatus according to claim 1, wherein:

the shadow mask and the inspection tool are provided on separate carriers exchangeably mounted on the movable portion;

mounting mechanisms are provided for mounting each carrier on the movable portion;

at least one of the mounting mechanisms comprises a limit stop element for holding the carrier in a predefined position;

the mounting mechanism comprises two parallel rod-like protrusions being insertable into corresponding parallel recesses;

the movable portion is a rotatable table, so that the shadow mask and the inspection tool are rotatable into the working position; a substrate holder being movable in a three-dimensional manner is provided;

a second inspection device is provided, the second inspection device having at least two inspection tools with contacts for electrically contacting the pattern; and the arrangement of the contacts corresponds to the arrangement of the apertures in the shadow mask.

* * * * *